(12) United States Patent
Ishiguro et al.

(10) Patent No.: US 10,667,391 B2
(45) Date of Patent: May 26, 2020

(54) PRINTED WIRING BOARD

(71) Applicant: IBIDEN CO., LTD., Ogaki (JP)

(72) Inventors: Naohito Ishiguro, Ogaki (JP); Takamitsu Hattori, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/448,189

(22) Filed: Jun. 21, 2019

(65) Prior Publication Data

US 2019/0394877 A1 Dec. 26, 2019

(30) Foreign Application Priority Data

Jun. 21, 2018 (JP) ................... 2018-117599

(51) Int. Cl.
*H05K 1/11* (2006.01)
*H05K 1/03* (2006.01)
*H05K 3/46* (2006.01)
*H05K 3/42* (2006.01)
*H05K 3/00* (2006.01)

(52) U.S. Cl.
CPC ............ *H05K 1/115* (2013.01); *H05K 1/036* (2013.01); *H05K 3/0035* (2013.01); *H05K 3/0038* (2013.01); *H05K 3/422* (2013.01); *H05K 3/423* (2013.01); *H05K 3/429* (2013.01); *H05K 3/4673* (2013.01); *H05K 2201/0275* (2013.01); *H05K 2203/107* (2013.01)

(58) Field of Classification Search
CPC .................................................. H05K 1/115
USPC ........................................................ 174/262
See application file for complete search history.

(56) References Cited

U.S. PATENT DOCUMENTS

2009/0229868 A1* 9/2009 Tsukada ............... H05K 3/4661
174/258
2018/0054890 A1* 2/2018 Ishihara ................. H05K 1/113

FOREIGN PATENT DOCUMENTS

JP 2004-319888 A 11/2004

* cited by examiner

*Primary Examiner* — Stanley Tso
(74) *Attorney, Agent, or Firm* — Oblon, McClelland, Maier & Neustadt, L.L.P.

(57) ABSTRACT

A printed wiring board includes a core substrate, a first build-up layer, and a second build-up layer. Each build-up layer includes a first insulating layer including reinforcing material, a second resin insulating layer not containing reinforcing material, a first via conductor through the first insulating layer, and a second via conductor through the second insulating layer such that the top diameter of the first via conductor is substantially equal to the top diameter of the second via conductor and that the bottom diameter of the first via conductor is smaller than the bottom diameter of the second via conductor. The conductor layer on the first insulating layer includes a metal foil, a seed layer and an electrolytic plating film. The conductor layer on the second insulating-layer includes a seed layer and an electrolytic plating film and has thickness substantially equal to thickness of the conductor layer on the first insulating-layer.

20 Claims, 6 Drawing Sheets

PRINTED WIRING BOARD

CROSS-REFERENCE TO RELATED APPLICATIONS

The present application is based upon and claims the benefit of priority to Japanese Patent Application No. 2018-117599, filed Jun. 21, 2018, the entire contents of which are incorporated herein by reference.

BACKGROUND OF THE INVENTION

Field of the Invention

The present invention relates to a printed wiring board that includes resin insulating layers that each have a reinforcing material and resin insulating layers that do not each have a reinforcing material.

Description of Background Art

Japanese Patent Laid-Open Publication No. 2004-319888 describes a printed wiring board that includes an inner-layer plate, an insulating layer that does not contain a reinforcing material and is formed on the inner-layer plate, and an insulating layer that contains a reinforcing material and is formed on the insulating layer that does not contain a reinforcing material. The entire contents of this publication are incorporated herein by reference.

SUMMARY OF THE INVENTION

According to one aspect of the present invention, a printed wiring board includes a core substrate, a first build-up layer formed on a first surface of the core substrate and including resin insulating layers, conductor layers, and via conductors penetrating through the resin insulating layers, and a second build-up layer formed on a second surface of the core substrate on the opposite side with respect to the first surface and including resin insulating layers, conductor layers, and via conductors penetrating through the resin insulating layers. The resin insulating layers in each of the first and second build-up layers include a first resin insulating layer including a reinforcing material and a second resin insulating layer not containing a reinforcing material. The conductor layers in each of the first and second build-up layers include an on-first-resin-insulating-layer conductor layer formed directly on a surface of the first resin insulating layer, a below-first-resin-insulating-layer conductor layer formed directly on the opposite surface of the first resin insulating layer, an on-second-resin-insulating-layer conductor layer formed directly on a surface of the second resin insulating layer, and a below-second-resin-insulating-layer conductor layer formed directly on the opposite surface of the second resin insulating layer. The via conductors in each of the first and second build-up layers include a first via conductor connecting the on-first-resin-insulating-layer conductor layer and the below-first-resin-insulating-layer conductor layer such that the first via conductor and the on-first-resin-insulating-layer conductor layer are integrally formed, and a second via conductor connecting the on-second-resin-insulating-layer conductor layer and the below-second-resin-insulating-layer conductor layer such that the second via conductor and the on-second-resin-insulating-layer conductor layer are integrally formed. The first and second via conductors in each of the first and second build-up layers are formed such that a first top diameter of the first via conductor at an interface between the on-first-resin-insulating-layer conductor layer and the first via conductor is substantially equal to a second top diameter of the second via conductor at an interface between the on-second-resin-insulating-layer conductor layer and the second via conductor, and that a first bottom diameter of the first via conductor at an interface between the below-first-resin-insulating-layer conductor layer and the first via conductor is smaller than a second bottom diameter of the second via conductor at an interface between the below-second-resin-insulating-layer conductor layer and the second via conductor. The on-first-resin-insulating-layer conductor layer in each of the first and second build-up layers includes a metal foil on the first resin insulating layer, a first seed layer on the metal foil and a first electrolytic plating film on the first seed layer. The on-second-resin-insulating-layer conductor layer in each of the first and second build-up layers includes a second seed layer on the second resin insulating layer and a second electrolytic plating film on the second seed layer. Each of the first and second build-up layers is formed such that the on-first-resin-insulating-layer conductor layer has a thickness substantially equal to a thickness of the on-second-resin-insulating-layer conductor layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Embodiments will now be described with reference to the accompanying drawings, wherein like reference numerals designate corresponding or identical elements throughout the various drawings.

Figure 1A:
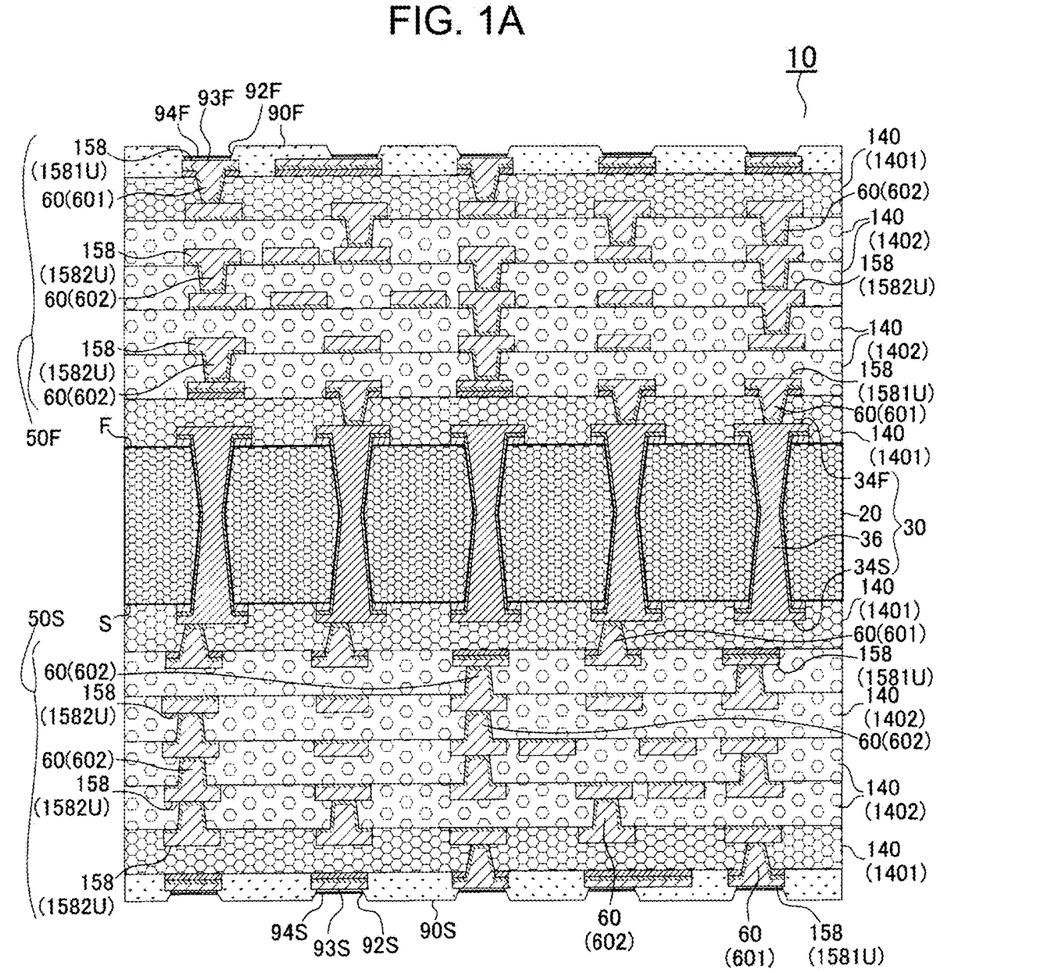
FIG. 1A is a cross-sectional view of a printed wiring board according to an embodiment of the present invention.

FIG. 1A is a cross-sectional view of a printed wiring board 10 of an embodiment.

The printed wiring board 10 has a core substrate 30 having a first surface (F) and a second surface (S) on an opposite side with respect to the first surface (F), a first build-up layer (50F) formed on the first surface (F) of the core substrate 30, and a second build-up layer (50S) formed on the second surface (S) of the core substrate 30. As illustrated in FIG. 1A, a first solder resist layer (90F) can be formed on the first build-up layer (50F). A second solder resist layer (90S) can be formed on the second build-up layer (50S).

The core substrate 30 has a core material 20 having a first surface (F) and a second surface (S) on an opposite side with respect to the first surface (F), a first conductor layer (34F) formed on the first surface (F) of the core material 20, and a second conductor layer (34S) formed on the second surface (S) of the core material 20. The core substrate 30 further has through-hole conductors 36 penetrating the core material 20. The first conductor layer (34F) and the second conductor layer (34S) are connected to each other via the through-hole conductors 36.

The first build-up layer (50F) and the second build-up layer (50S) are formed of resin insulating layers 140, conductor layers 158, and via conductors 60 penetrating the resin insulating layers 140. The resin insulating layers 140 and the conductor layers 158 are alternately laminated.

The resin insulating layers 140 include two kinds of resin insulating layers (1401, 1402). The two kinds of resin insulating layers (1401, 1402) are first resin insulating layers 1401 that each contain a reinforcing material and second resin insulating layers 1402 that do not each contain a reinforcing material. Arrangement and the number of the first resin insulating layers 1401 and arrangement and the number of the second resin insulating layers 1402 are not limited. The first resin insulating layers 1401 in the first build-up layer (50F) and the first resin insulating layers 1401 in the second build-up layer (50S) are symmetrically arranged with respect to the core substrate 30. The second resin insulating layers 1402 in the first build-up layer (50F) and the second resin insulating layers 1402 in the second build-up layer (50S) are symmetrically arranged with respect to the core substrate 30. The number of the first resin insulating layers 1401 in the first build-up layer (50F) and the number of the first resin insulating layers 1401 in the second build-up layer (50S) are the same. The number of the second resin insulating layers 1402 in the first build-up layer (50F) and the number of the second resin insulating layers 1402 in the second build-up layer (50S) are the same.

In the printed wiring board 10 illustrated in FIG. 1A, six resin insulating layers 140 are laminated on the first surface (F) of the core substrate 30. A resin insulating layer 140 formed directly on the first surface (F) of the core substrate 30 is an on-first-surface resin insulating layer, and an outermost resin insulating layer in the first build-up layer is an uppermost resin insulating layer. The on-first-surface resin insulating layer is in contact with the first surface (F) of the core material and with the first conductor layer (34F).

When the on-first-surface resin insulating layer and the uppermost resin insulating layer are formed of the first resin insulating layers 1401 and all resin insulating layers 140 positioned between the on-first-surface resin insulating layer and the uppermost resin insulating layer are formed of the second resin insulating layers 1402, warpage of the printed wiring board can be reduced. When the number of the second resin insulating layers 1402 positioned between the on-first-surface resin insulating layer and the uppermost resin insulating layer is 3, or 4, or 5, a warpage amount can be controlled. When the number of the second resin insulating layers 1402 is 3, a direction of warpage can be controlled. Therefore, an electronic component can be reliably mounted on the printed wiring board. Connection reliability between the electronic component and the printed wiring board can be improved.

In the printed wiring board 10 illustrated in FIG. 1A, six resin insulating layers 140 are laminated on the second surface (S) of the core substrate 30. A resin insulating layer 140 formed directly on the second surface (S) of the core substrate 30 is an on-second-surface resin insulating layer, and an outermost resin insulating layer in the second build-up layer is a lowermost resin insulating layer. The on-second-surface resin insulating layer is in contact with the second surface (S) of the core material and with the second conductor layer (34S).

When the on-second-surface resin insulating layer and the lowermost resin insulating layer are formed of the first resin insulating layers 1401 and all resin insulating layers 140 positioned between the on-second-surface resin insulating layer and the lowermost resin insulating layer are formed of the second resin insulating layers 1402, warpage of the printed wiring board can be reduced. When the number of the second resin insulating layers 1402 positioned between the on-second-surface resin insulating layer and the lowermost resin insulating layer is 3, or 4, or 5, a warpage amount can be controlled. When the number of the second resin insulating layers 1402 is 3, a direction of warpage can be controlled. Therefore, an electronic component can be reliably mounted on the printed wiring board. Connection reliability between the electronic component and the printed wiring board can be improved.

In the printed wiring board 10 of FIG. 1A, the first resin insulating layers 1401 having a high strength sandwich the second resin insulating layers 1402 having a low strength. Therefore, a printed wiring board having small warpage can be provided.

The number of the resin insulating layers 140 positioned between the on-first-surface resin insulating layer and the uppermost resin insulating layer and the number of the resin insulating layers 140 positioned between the on-second-surface resin insulating layer and the lowermost resin insulating layer are equal to each other.

The conductor layers 158 include on-first-resin-insulating-layer conductor layers (1581U), below-first-resin-insulating-layer conductor layers (1581L), on-second-resin-insulating-layer conductor layers (1582U), and below-second-resin-insulating-layer conductor layers (1582L).

The on-first-resin-insulating-layer conductor layers (1581U) are respectively formed directly on the first resin insulating layers 1401, and the below-first-resin-insulating-layer conductor layers (1581L) are respectively formed directly below the first resin insulating layers 1401. The on-first-resin-insulating-layer conductor layers (1581U) and the below-first-resin-insulating-layer conductor layers (1581L) are in contact with the first resin insulating layers 1401, and the first resin insulating layers 1401 are each sandwiched by an on-first-resin-insulating-layer conductor layer (1581U) and a below-first-resin-insulating-layer conductor layer (1581L).

The on-second-resin-insulating-layer conductor layers (1582U) are respectively formed directly on the second resin insulating layers 1402, and the below-second-resin-insulating-layer conductor layers (1582L) are respectively formed directly below the second resin insulating layers 1402. The on-second-resin-insulating-layer conductor layers (1582U) and the below-second-resin-insulating-layer conductor layers (1582L) are in contact with the second resin insulating layers 1402, and the second resin insulating layers 1402 are each sandwiched by an on-second-resin-insulating-layer conductor layer (1582U) and a below-second-resin-insulating-layer conductor layer (1582L).

In the example of FIG. 1A, the conductor layers 158 in the first build-up layer (50F) and the conductor layers 158 in the second build-up layer (50S) are laminated on the core substrate in an order of an on-first-resin-insulating-layer conductor layer (1581U), an on-second-resin-insulating-layer conductor layer (1582U), an on-second-resin-insulating-layer conductor layer (1582U), an on-second-resin-insulating-layer conductor layer (1582U), an on-second-resin-insulating-layer conductor layer (1582U), and an on-first-resin-insulating-layer conductor layer (1581U).

In the example of FIG. 1A, the first conductor layer (34F) is formed below a first resin insulating layer 1401. In this case, the first conductor layer (34F) doubles as a below-first-resin-insulating-layer conductor layer (1581L).

In the example of FIG. 1A, the second conductor layer (34S) is formed below a first resin insulating layer 1401. In this case, the second conductor layer (34S) doubles as a below-first-resin-insulating-layer conductor layer (1581L).

In the example of FIG. 1A, a second resin insulating layer 1402 is formed on a first resin insulating layer 1401. In this case, an on-first-resin-insulating-layer conductor layer (1581U) doubles as a below-second-resin-insulating-layer conductor layer (1582L).

In the example of FIG. 1A, a second resin insulating layer 1402 is formed on a second resin insulating layer 1402. In this case, an on-second-resin-insulating-layer conductor layer (1582U) doubles as a below-second-resin-insulating-layer conductor layer (1582L).

In the example of FIG. 1A, a first resin insulating layer 1401 is formed on a second resin insulating layer 1402. In this case, an on-second-resin-insulating-layer conductor layer (1582U) doubles as a below-first-resin-insulating-layer conductor layer (1581L).

When a first resin insulating layer 1401 is formed on a first resin insulating layer 1401, an on-first-resin-insulating-layer conductor layer (1581U) doubles as a below-first-resin-insulating-layer conductor layer (1581L).

When the first conductor layer (34F) is formed below a second resin insulating layer 1402, the first conductor layer (34F) doubles as a below-second-resin-insulating-layer conductor layer (1582L).

When the second conductor layer (34S) is formed below a second resin insulating layer 1402, the second conductor layer (34S) doubles as a below-second-resin-insulating-layer conductor layer (1582L).

The first solder resist layer (90F) having first openings (92F) is formed on the first build-up layer (50F). The conductor layer 158 exposed from the first openings (92F) forms pads (93F) for mounting an electronic component. A metal film (94F) formed of Ni/Pd/Au is formed on the pads (93F).

The second solder resist layer (90S) having second openings (92S) is formed on the second build-up layer (50S). The conductor layer 158 exposed from the second openings (92S) forms pads (93S) for connecting to a motherboard. A metal film (94S) formed of Ni/Pd/Au is formed on the pads (93S).

Figures 1B, 1C:
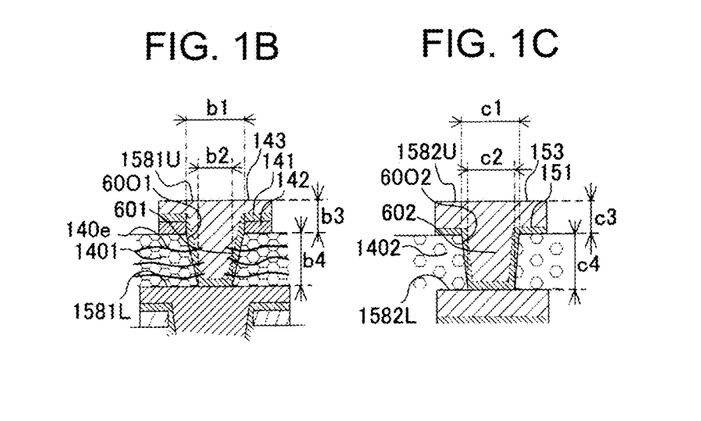
FIG. 1B is an explanatory diagram of a first via conductor.
FIG. 1C is an explanatory diagram of a second via conductor.

FIG. 1B illustrates a first resin insulating layer 1401, an on-first-resin-insulating-layer conductor layer (1581U), a below-first-resin-insulating-layer conductor layer (1581L), a first opening (60O1), and a first via conductor 601. The first resin insulating layer 1401 is sandwiched by the on-first-resin-insulating-layer conductor layer (1581U) and the below-first-resin-insulating-layer conductor layer (1581L), which are connected to each other by the first via conductor 601 that penetrates the first resin insulating layer 1401 and fills the first opening (60O1).

FIG. 1C illustrates a second resin insulating layer 1402, an on-second-resin-insulating-layer conductor layer (1582U), a below-second-resin-insulating-layer conductor layer (1582L), a second opening (60O2), and a second via conductor 602. The second resin insulating layer 1402 is sandwiched by the on-second-resin-insulating-layer conductor layer (1582U) and the below-second-resin-insulating-layer conductor layer (1582L), which are connected to each other by the second via conductor 602 that penetrates the second resin insulating layer 1402 and fills the second opening (60O2).

The on-first-resin-insulating-layer conductor layer (1581U) is formed of a metal foil 142 on the first resin insulating layer 1401, a first seed layer 141 on the metal foil 142, and a first electrolytic plating film 143 on the first seed layer 141. The on-first-resin-insulating-layer conductor layer (1581U) is formed of three kinds of metal films and has a thickness (b3).

The on-second-resin-insulating-layer conductor layer (1582U) is formed of a second seed layer 151 on the second resin insulating layer 1402, and a second electrolytic plating film 153 on the second seed layer 151. The on-second-resin-insulating-layer conductor layer (1582U) is formed of two kinds of metal films and has a thickness (c3).

The on-first-resin-insulating-layer conductor layer (1581U) includes a metal foil, and the on-second-resin-insulating-layer conductor layer (1582U) does not include a metal foil. Therefore, it is not easy to make the thickness (b3) and the thickness (c3) the same thickness. For example, the thickness (b3) is larger than the thickness (c3). When the thickness (b3) and the thickness (c3) are different from each other, for example, in the printed wiring board, there are conductor layers having a high strength and conductor layers having a low strength. Warpage of the printed wiring board is likely to become large.

As illustrated in FIG. 1B, the first resin insulating layer 1401 is formed of a reinforcing material (140e), a resin, and inorganic particles. In contrast, as illustrated in FIG. 1C, the second resin insulating layer 1402 is formed of a resin and inorganic particles. The second resin insulating layer 1402 does not have a reinforcing material (140e). A strength of the first resin insulating layer 1401 is higher than a strength of the second resin insulating layer 1402.

The first resin insulating layer 1401 has the first opening (60O1) for the first the via conductor 601 and has a thickness (b4). The thickness (b4) is a distance between the on-first-resin-insulating-layer conductor layer (1581U) and the below-first-resin-insulating-layer conductor layer (1581L).

As illustrated in FIG. 1B, the first opening (60O1) has a first top diameter (b1) at an interface between the on-first-resin-insulating-layer conductor layer (1581U) and the first resin insulating layer 1401. The first opening (60O1) has a first bottom diameter (b2) at an interface between the below-first-resin-insulating-layer conductor layer (1581L) and the first resin insulating layer 1401. The first opening (60O1) is tapered from the on-first-resin-insulating-layer conductor layer (1581U) toward the below-first-resin-insulating-layer conductor layer (1581L). The first top diameter (b1) is larger than the first bottom diameter (b2).

As illustrated in FIG. 1C, the second resin insulating layer 1402 has the second opening (60O2) for the second via conductor 602 and has a thickness (c4). The thickness (c4) is a distance between the on-second-resin-insulating-layer conductor layer (1582U) and the below-second-resin-insulating-layer conductor layer (1582L).

As illustrated in FIG. 1C, the second opening (6O2) has a second top diameter (c1) at an interface between the on-second-resin-insulating-layer conductor layer (1582U) and the second resin insulating layer 1402. The second opening (6O2) has a second bottom diameter (c2) at an interface between the below-second-resin-insulating-layer conductor layer (1582L) and the second resin insulating layer 1402. The second opening (6O2) is tapered from the on-second-resin-insulating-layer conductor layer (1582U) toward the below-second-resin-insulating-layer conductor layer (1582L). The second top diameter (c1) is larger than the second bottom diameter (c2).

The first top diameter (b1) and the second top diameter (c1) are substantially equal to each other. A ratio (b1/c1) of the first top diameter (b1) to the second top diameter is 0.92 or more and 1.08 or less. The first bottom diameter (b2) is smaller than the second bottom diameter (c2). Volumes of the openings (6O1, 6O2) for the via conductors can be adjusted by adjusting the top diameters and bottom diameters of the openings (6O1, 6O2). By making the first bottom diameter (b2) smaller than the second bottom diameter (c2), the volume of the first opening (6O1) can be reduced. For example, the volume of the first opening (6O1) can be made smaller than the volume of the second opening (6O2).

Figure 6A:
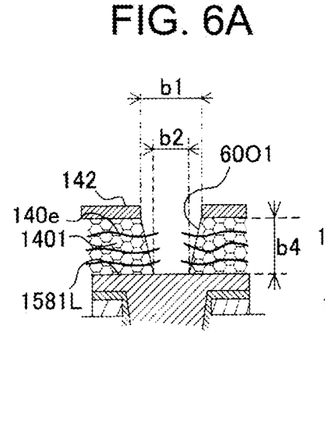
FIG. 6A is an explanatory diagram of a first opening.

As illustrated in FIGS. 1B and 6A, the reinforcing material (140e) enters into the first opening (6O1). The reinforcing material (140e) forming the first resin insulating layer 1401 extends beyond a side wall of the first opening (6O1) and into the first opening (6O1). The reinforcing material (140e) is not continuous in the first opening (6O1). For example, by reducing an energy of a laser beam for forming the first opening (6O1), the reinforcing material (140e) enters into the first opening (6O1). The reinforcing material (140e) is formed of a fiber, and a glass cloth is preferable.

The volume of the first opening (6O1) can be adjusted by the reinforcing material (140e) protruding into the first opening (6O1). The volume of the first opening (6O1) can be reduced by causing the reinforcing material (140e) to protrude into the first opening (6O1). For example, the volume of the first opening (6O1) can be made smaller than the volume of the second opening (6O2).

The first via conductor 601 fills the first opening (6O1). The first via conductor 601 has a first top diameter (b1) at an interface between the on-first-resin-insulating-layer conductor layer (1581U) and the first via conductor 601, and has a first bottom diameter (b2) at an interface between the below-first-resin-insulating-layer conductor layer (1581L) and the first via conductor 601. The first bottom diameter (b2) of the first via conductor 601 and the first bottom diameter (b2) of the first opening (6O1) are the same. The first top diameter (b1) of the first via conductor 601 and the first top diameter (b1) of the first opening (6O1) are the same. The interface between the below-first-resin-insulating-layer conductor layer (1581L) and the first via conductor 601 and the interface between the below-first-resin-insulating-layer conductor layer (1581L) and the first resin insulating layer 1401 are the same surface. The interface between the on-first-resin-insulating-layer conductor layer (1581U) and the first via conductor 601 and the interface between the on-first-resin-insulating-layer conductor layer (1581U) and the first resin insulating layer 1401 are the same surface.

As illustrated in FIG. 1B, the reinforcing material enters into the first via conductor 601. The reinforcing material sticks into the first via conductor 601.

The second via conductor 602 fills the second opening (6O2). The second via conductor 602 has a second top diameter (c1) at an interface between the on-second-resin-insulating-layer conductor layer (1582U) and the second via conductor 602, and has a second bottom diameter (c2) at an interface between the below-second-resin-insulating-layer conductor layer (1582L) and the second via conductor 602. The second bottom diameter (c2) of the second via conductor 602 and the second bottom diameter (c2) of the second opening (6O2) are the same. The second top diameter (c1) of the second via conductor 602 and the second top diameter (c1) of the second opening (6O2) are the same. The interface between the below-second-resin-insulating-layer conductor layer (1582L) and the second via conductor 602 and the interface between the below-second-resin-insulating-layer conductor layer (1582L) and the second resin insulating layer 1402 are the same surface. The interface between the on-second-resin-insulating-layer conductor layer (1582U) and the second via conductors 602 and the interface between the on-second-resin-insulating-layer conductor layer (1582U) and the second resin insulating layer 1401 are the same surface.

The first via conductor 601 is formed of a first seed layer 141 and a first electrolytic plating film 143 on the first seed layer 141. Most of the first opening (6O1) is filled by the first electrolytic plating film 143. The first seed layer 141 is in contact with the below-first-resin-insulating-layer conductor layer (1581L) and the first resin insulating layer 1401 exposed from the first opening (6O1).

The first seed layer 141 forming the on-first-resin-insulating-layer conductor layer (1581U) and the first seed layer 141 forming the first via conductor 601 are in common, and the two are simultaneously formed. The first electrolytic plating film 143 forming the on-first-resin-insulating-layer conductor layer (1581U) and the first electrolytic plating film 143 forming the first via conductor 601 are in common, and the two are simultaneously formed. The on-first-resin-insulating-layer conductor layer (1581U) and the first via conductor 601 are integrally found. Therefore, an amount of the first electrolytic plating film 143 for filling the first opening (6O1) is related to a thickness of the first electrolytic plating film 143. By reducing the amount of the first electrolytic plating film 143 for filling the first opening (6O1), the thickness (b3) of the on-first-resin-insulating-layer conductor layer (1581U) can be reduced.

The second via conductor 602 is formed of a second seed layer 151 and a second electrolytic plating film 153 on the second seed layer 151. Most of the second opening (6O2) is filled by the second electrolytic plating film 153. The second seed layer 151 is in contact with the below-second-resin-insulating-layer conductor layer (1582L) and the second resin insulating layer 1402 exposed from the second opening (6O2).

The second seed layer 151 forming the on-second-resin-insulating-layer conductor layer (1582U) and the second seed layer 151 forming the second via conductor 602 are in common, and the two are simultaneously formed. The second electrolytic plating film 153 forming the on-second-resin-insulating-layer conductor layer (1582U) and the second electrolytic plating film 153 forming the second via conductor 602 are in common, and the two are simultaneously formed. The on-second-resin-insulating-layer conductor layer (1582U) and the second via conductor 602 are integrally formed. Therefore, an amount of the second electrolytic plating film 153 for filling the second opening (6O2) is related to a thickness of the second electrolytic plating film 153 forming the on-second-resin-insulating-layer conductor layer (1582U). By increasing the amount of the second electrolytic plating film 153 for filling the second opening (6O2), the thickness (c3) of the on-second-resin-insulating-layer conductor layer (1582U) can be increased.

The on-first-resin-insulating-layer conductor layer (1581U) includes a metal foil, and the on-second-resin-insulating-layer conductor layer (1582U) does not include a metal foil. Only the on-first-resin-insulating-layer conductor layer (1581U) includes a metal foil. Therefore, the thickness (b3) of the on-first-resin-insulating-layer conductor layer (1581U) is likely to become larger than the thickness (c3) of the on-second-resin-insulating-layer conductor layer (1582U). However, in the embodiment, the first bottom diameter (b2) is smaller than the second bottom diameter (c2). Therefore, the volume of the first opening (6O1) for the first via conductor 601 which is simultaneously formed with the on-first-resin-insulating-layer conductor layer (1581U) can be reduced. The volume of the second opening (6O2) for the second via conductor 602 which is simultaneously formed with the on-second-resin-insulating-layer conductor layer (1582U) can be increased. Therefore, the thickness of the first electrolytic plating film 143 forming the on-first-resin-insulating-layer conductor layer (1581U) can be reduced. The thickness of the second electrolytic plating film 153 forming the on-second-resin-insulating-layer conductor layer (1582U) can be increased. Therefore, even when only the on-first-resin-insulating-layer conductor layer (1581U) includes a metal foil, the thickness of the on-first-resin-insulating-layer conductor layer (1581U) and the thickness of the on-second-resin-insulating-layer conductor layer (1582U) can be made substantially equal to each other.

The first opening (6O1) has a reinforcing material therein, and the second opening (6O2) does not have a reinforcing material therein. Therefore, the volume of the first opening (6O1) can be adjusted by the reinforcing material. The volume of the first opening (6O1) can be reduced by the reinforcing material. Therefore, the thickness of the first electrolytic plating film 143 forming the on-first-resin-insulating-layer conductor layer (1581U) can be adjusted by the reinforcing material (140e). By combining the adjustment of the bottom diameter of the opening and the protrusion of the reinforcing material, the thickness (b3) of the on-first-resin-insulating-layer conductor layer (1581U) can be made close to the thickness (c3) of the on-second-resin-insulating-layer conductor layer (1582U).

When the reinforcing material enters into the first via conductor 601, the amount of the first electrolytic plating film 143 for forming the first via conductor 601 can be reduced. Therefore, the thickness of the first electrolytic plating film 143 forming the on-first-resin-insulating-layer conductor layer (1581U) can be reduced. Therefore, even when the on-first-resin-insulating-layer conductor layer (1581U) has the metal foil 142, the thickness (b3) of the on-first-resin-insulating-layer conductor layer (1581U) can be reduced.

By combining the adjustment of the bottom diameters and the protrusion of the reinforcing material into the via conductor, the volumes of the first via conductor 601 and the second via conductor 602 can be adjusted. The thickness of the first electrolytic plating film 143 and the thickness of the second electrolytic plating film 153 can be adjusted. The thickness (b3) of the on-first-resin-insulating-layer conductor layer (1581U) and the thickness (c3) of the on-second-resin-insulating-layer conductor layer (1582U) are substantially equal to each other.

Figure 6B:
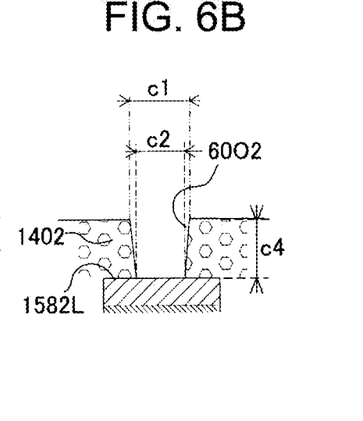
FIG. 6B is an explanatory diagram of a second opening.
Figure 6C:
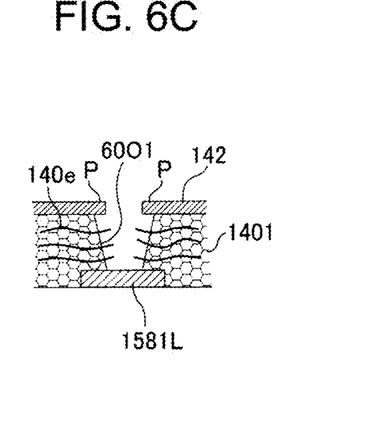
FIG. 6C illustrates a protruding part.

As illustrated in FIG. 6C, the metal foil 142 forming the on-first-resin-insulating-layer conductor layer (1581U) can have a protruding part (P) on the first opening (6O1). For example, by reducing an energy of a laser beam for forming the first opening (6O1), the protruding part (P) can be formed. The thickness of the electrolytic plating film 143 forming the on-first-resin-insulating-layer conductor layer (1581U) can be reduced by the protruding part (P). Therefore, a ratio (thickness (b3)/thickness (c3)) of the thickness (b3) of the on-first-resin-insulating-layer conductor layer (1581U) to the thickness (c3) of the on-second-resin-insulating-layer conductor layer (1582U) can be close to 1.

The printed wiring board of the embodiment has different resin insulating layers and different conductor layers. However, the thicknesses of the conductor layers are substantially equal to each other. For example, the difference between the strength of the on-first-resin-insulating-layer conductor layer (1581U) and the strength of the on-second-resin-insulating-layer conductor layer (1582U) can be reduced. Therefore, warpage of the printed wiring board can be reduced. A direction of the warpage of the printed wiring board can be controlled. A high density conductor circuit can be formed in the on-first-resin-insulating-layer conductor layer (1581U). A high density conductor circuit can be formed in the on-second-resin-insulating-layer conductor layer (1582U). Since design flexibility is high, impedance matching is facilitated.

The top diameter (b1) of the first via conductor 601 is 40 μm or more and 70 μm or less. The top diameter (c1) of the second via conductor 602 is 40 μm or more and 70 μm or less. The thickness (b3) of the on-first-resin-insulating-layer conductor layer (1581U) is 10 μm or more and 20 μm or less. The thickness (c3) of the on-second-resin-insulating-layer conductor layer (1582U) is 10 μm or more and 20 μm or less. When the printed wiring board of the embodiment has such numerical ranges, a substantially flat printed wiring board can be provided.

The thickness (b4) and the thickness (c4) are substantially equal to each other. A ratio (b4/c4) of the thickness (b4) to the thickness (c4) is 0.9 or more and 1.1 or less. By making the first bottom diameter (b2) smaller than the second bottom diameter (c2), the volume of the first opening (6O1) and the volume of the second opening (6O2) can be adjusted. The thickness (b3) and the thickness (c3) can be made substantially the same thickness. The ratio (b2/c2) is 0.7 or more and 0.9 or less.

When the ratio (b4/c4) is 1.25 or more, the difference between the volume of the first opening (6O1) and the volume of the second opening (6O2) is likely to increase. In order to reduce the difference between the volume of the first opening (6O1) and the volume of the second opening (6O2), the bottom diameter (b2) of the first opening (6O1) is smaller than the bottom diameter (c2) of the second opening (6O2). Further, when the ratio (b4/c4) is 1.35 or less and the reinforcing material protrudes into the first opening (6O1), the difference between the volume of the first opening (6O1) and the volume of the second opening (6O2) decreases. Further, when the protruding part (P) of the metal foil is formed on the first opening (6O1), the difference between the volume of the first opening (6O1) and the volume of the second opening (6O2) can be reduced. Even when the ratio (b4/c4) is 1.25 or more and 1.35 or less, the thickness (b3) and the thickness (c3) can be made substantially the same thickness.

The thickness (b3) and the thickness (c3) are substantially equal to each other. A ratio (b3/c3) of the thickness (b3) to the thickness (c3) is 0.92 or more and 1.08 or less. Warpage of the printed wiring board 10 can be reduced.

Modified Embodiments of the Embodiment

Figure 6D:
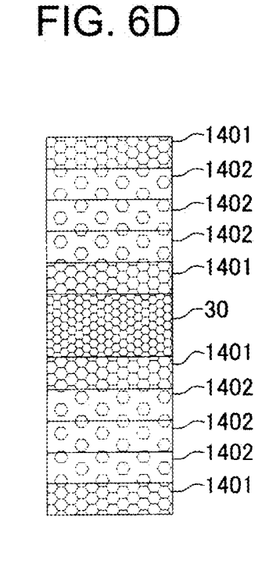
FIGS. 6D-6F are schematic diagrams illustrating other examples of the embodiment.
Figure 6E:
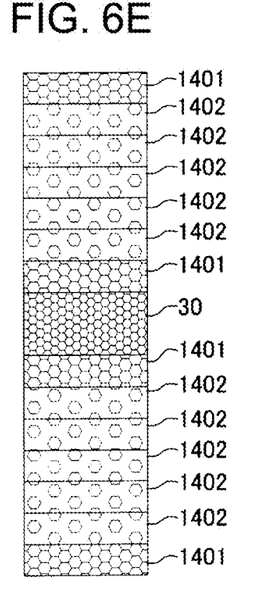
Figure 6F:
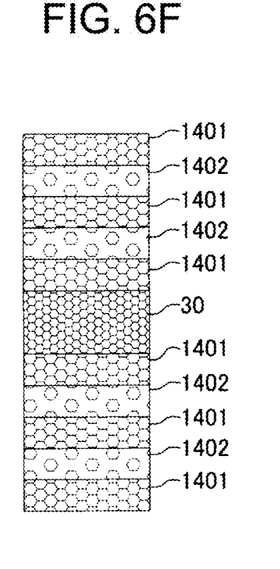

Other examples of the embodiment are illustrated in FIGS. 6D-6F. FIGS. 6D-6F are schematic diagrams and illustrate arrangements of the first resin insulating layers 1401 and the second resin insulating layers 1402. In these diagrams, through-hole conductors, via conductors, conductor layers, and solder resist layers are omitted.

In the example of FIG. 6D, the resin insulating layers 140 are laminated on the core substrate 30 in an order of a first resin insulating layer 1401, a second resin insulating layer 1402, a second resin insulating layer 1402, a second resin insulating layer 1402, and a first resin insulating layer 1401.

In the example of FIG. 6E, the resin insulating layers 140 are laminated on the core substrate 30 in an order of a first resin insulating layer 1401, a second resin insulating layer 1402, a second resin insulating layer 1402, a second resin insulating layer 1402, a second resin insulating layer 1402, a second resin insulating layer 1402, and a first resin insulating layer 1401.

In the example of FIG. 6F, the resin insulating layers 140 are laminated on the core substrate 30 in an order of a first resin insulating layer 1401, a second resin insulating layer 1402, a first resin insulating layer 1401, a second resin insulating layer 1402, and a first resin insulating layer 1401.

Manufacturing Method of Embodiment

FIGS. 2A-5B illustrate a method for manufacturing the printed wiring board 10 of the embodiment.

Figure 2A:
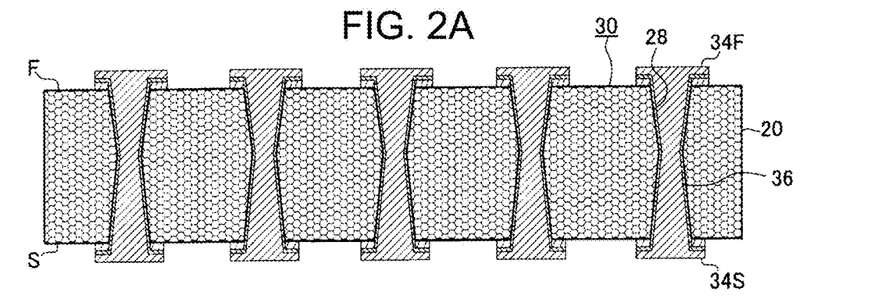
FIGS. 2A-2D are manufacturing process diagrams of the printed wiring board of the embodiment of the present invention.

A double-sided copper-clad laminated plate is prepared that includes the core material 20 having the first surface (F) and the second surface (S) on an opposite side with respect to the first surface (F) and a copper foil laminated on both sides of the core material 20. Through holes 28 for through-hole conductors are formed in the double-sided copper-clad laminated plate. The through-hole conductors 36 are formed in the through holes 28 for through-hole conductors. After that, using a subtractive method, the first conductor layer (34F) is formed on the first surface (F) of the core material 20. The second conductor layer (34S) is formed on the second surface (S) of the core material 20, and the core substrate 30 is completed (FIG. 2A).

Subsequently, only a method for forming the first build-up layer (50F) is illustrated. This is because the second build-up layer (50S) is formed using the same method as the first build-up layer (50F). A method for forming the first resin insulating layers 1401 in the first build-up layer (50F) and a method for forming the first resin insulating layers 1401 in the second build-up layer (50S) are the same. A method for forming the second resin insulating layers 1402 in the first build-up layer (50F) and a method for forming the second resin insulating layers 1402 in the second build-up layer (50S) are the same. A method for forming the on-first-resin-insulating-layer conductor layers (1581U) in the first build-up layer (50F) and a method for forming the on-first-resin-insulating-layer conductor layers (1581U) in the second build-up layer (50S) are the same. A method for forming the on-second-resin-insulating-layer conductor layers (1582U) in the first build-up layer (50F) and a method for forming the on-second-resin-insulating-layer conductor layers (1582U) in the second build-up layer (50S) are the same. A method for forming the first openings (6O1) in the first build-up layer (50F) and a method for forming the first openings (6O1) in the second build-up layer (50S) are the same. A method for forming the second openings (6O2) in the first build-up layer (50F) and a method for forming the second openings (6O2) in the second build-up layer (50S) are the same. A method for forming the first via conductors 601 in the first build-up layer (50F) and a method for forming the first via conductors 601 in the second build-up layer (50S) are the same. A method for forming the second via conductors 602 in the first build-up layer (50F) and a method for forming the second via conductors 602 in the second build-up layer (50S) are the same.

Figure 2B:
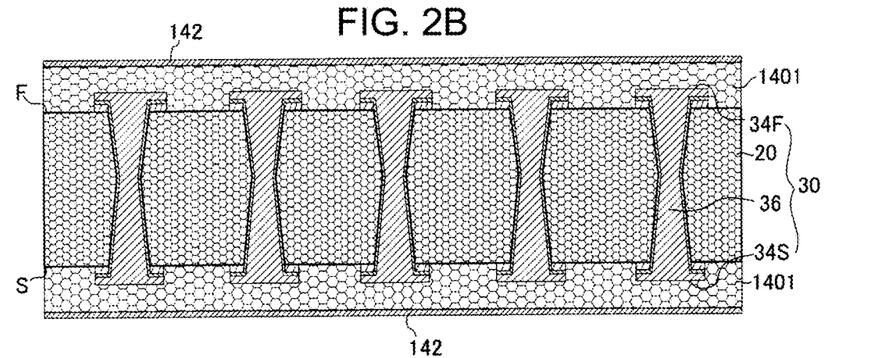

A prepreg is laminated on the first surface (F) of the core substrate 30. Further, a copper foil 142 is laminated on the prepreg. The prepreg is formed of a glass cloth, a resin and silica particles. The prepreg is cured by hot pressing. A first resin insulating layer 1401 is formed on the first surface (F). At the same time, the copper foil 142 is bonded to the first resin insulating layer 1401 (FIG. 2B). The first resin insulating layer 1401 on the first surface (F) is the on-first-surface resin insulating layer. The on-second-surface resin insulating layer formed of a first resin insulating layer 1401 is formed on the second surface (S) of the core substrate 30. The thickness (b4) of the on-first-surface resin insulating layer is 30 μm. The thickness (b4) of the on-second-surface resin insulating layer is also 30 μm.

Figure 2C:
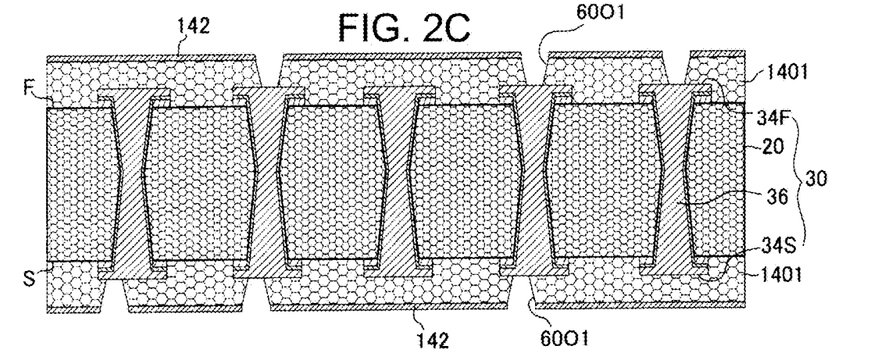

The first openings (6O1) penetrating the copper foil 142 and the on-first-surface resin insulating layer 1401 and reaching the first conductor layer (34F) are formed using laser (FIG. 2C). The first openings (6O1) are each formed by irradiating a laser beam twice. The first top diameter (b1) of each of the first openings (6O1) is 65 μm. The first bottom diameter (b2) of each of the first openings (6O1) is 45 μm. As illustrated in FIG. 6A, the reinforcing material (140e) enters into the first openings (6O1). As illustrated in FIG. 6C, the protruding part (P) formed of the metal foil 142 such as a copper foil may be formed on each of the first openings (6O1).

Figure 2D:
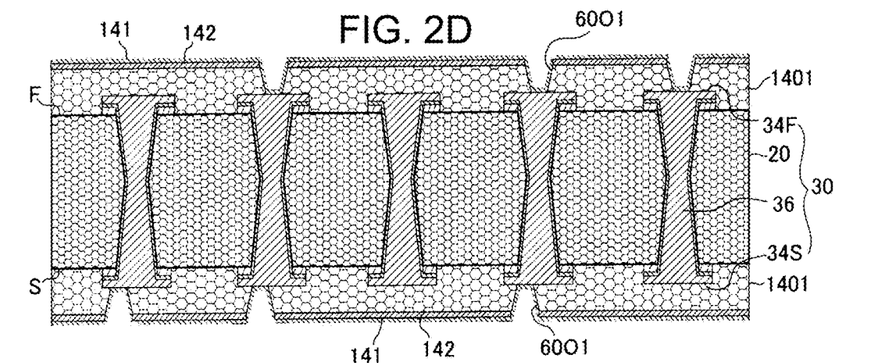

The first seed layer 141 is formed on the copper foil 142 and on inner walls of the first openings (6O1) by electroless copper plating (FIG. 2D). The first seed layer 141 is formed of an electroless plating film.

Figure 3A:
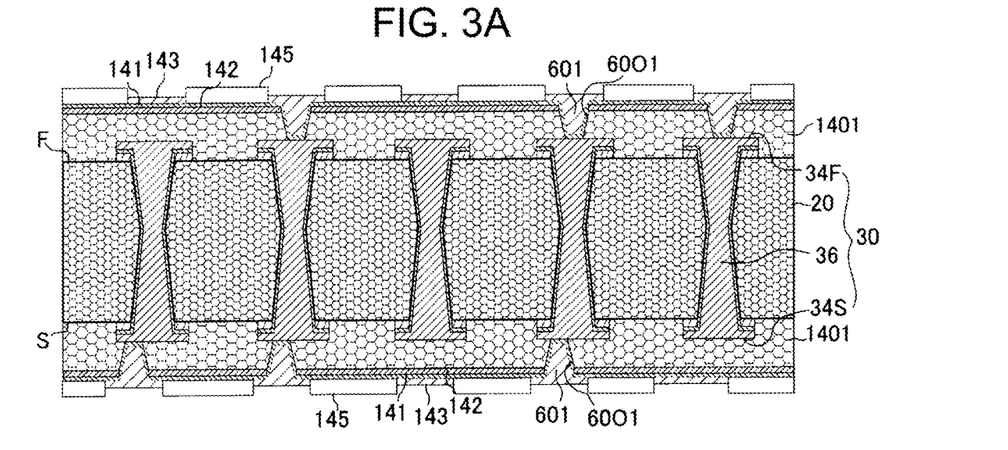
FIGS. 3A-3C are manufacturing process diagrams of the printed wiring board of the embodiment of the present invention.
Figure 3B:
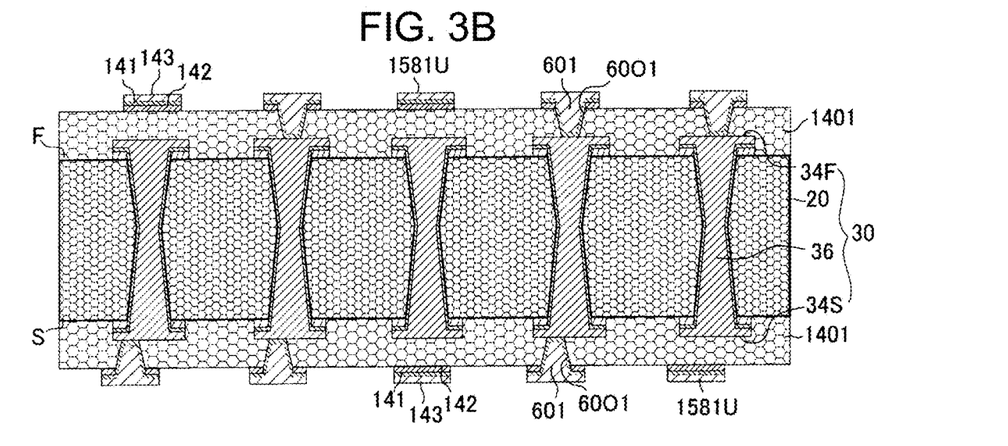

A plating resist 145 is formed on the first seed layer 141. The first electrolytic plating film 143 is fainted by electrolytic plating on the first seed layer 141 exposed from the plating resist 145. At the same time, the first openings (6O1) are filled by the first electrolytic plating film 143 (FIG. 3A). The plating resist 145 is removed. The first seed layer 141 and the copper foil 142 exposed from the first electrolytic plating film 143 are removed. An on-first-resin-insulating-layer conductor layer (1581U) is formed on the on-first-surface resin insulating layer 1401. At the same time, the first via conductors 601 are formed in the first openings (6O1) (FIG. 3B). The thickness (b3) of the on-first-resin-insulating-layer conductor layer (1581U) is 15.5 μm.

A second resin insulating layer 1402 is formed on the on-first-surface resin insulating layer 1401 and the on-first-resin-insulating-layer conductor layer (1581U). The thickness (c4) of the second resin insulating layer 1402 is 30 μm. The second openings (6O2) penetrating the second resin insulating layer 1402 and reaching the on-first-resin-insulating-layer conductor layer (1581U) are formed using laser. The second openings (6O2) are each fainted by irradiating a laser beam three times. Laser beams for forming the first openings (6O1) and the second openings (6O2) have the same energy and the same diameter. The second top diameter (c1) of each of the second openings (6O2) is 65 μm.

The second bottom diameter (c2) of each of the second openings (6O2) is 50 μm. The diameter (c1) and the diameter (c2) are illustrated in FIG. 6B.

Figure 3C:
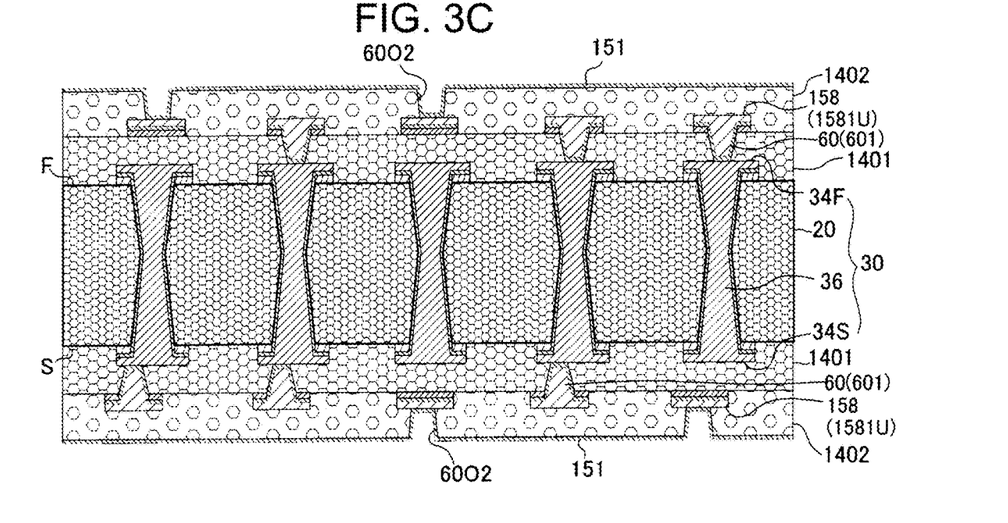
Figure 4A:
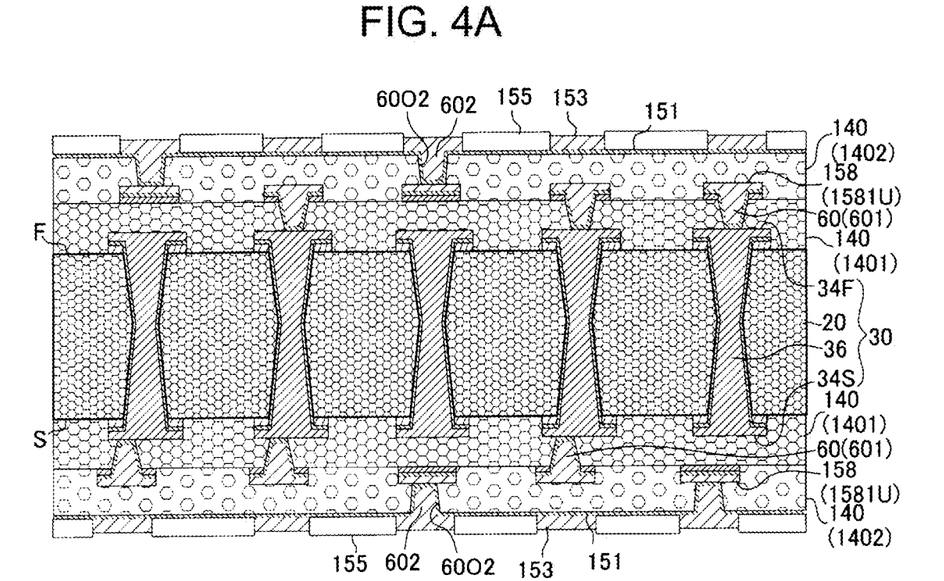
FIGS. 4A and 4B are manufacturing process diagrams of the printed wiring board of the embodiment of the present invention.
Figure 4B:
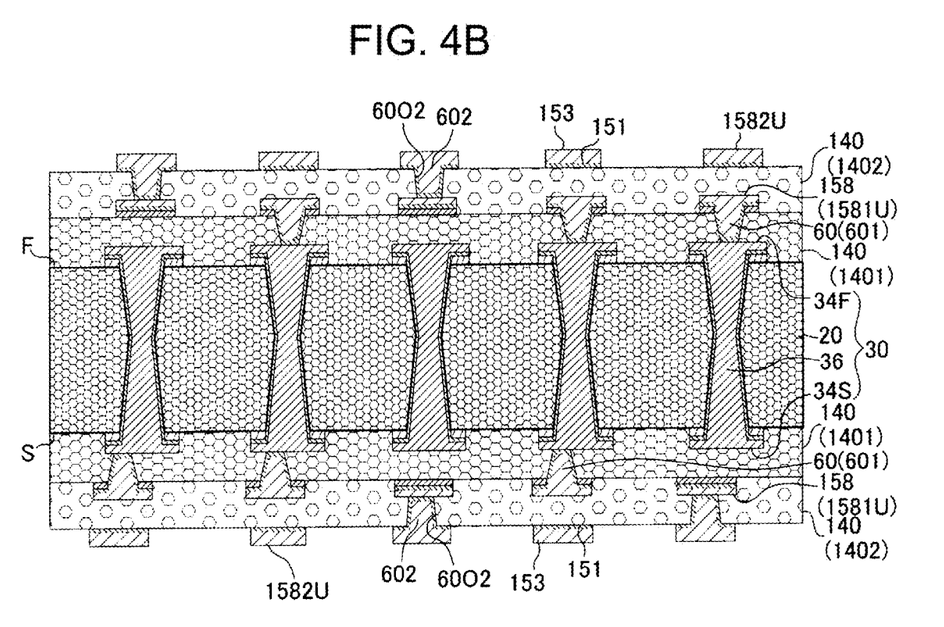

A second seed layer 151 formed of an electroless plating film is formed by electroless plating on the second resin insulating layer 1402 and on inner walls of the second openings (6O2) (FIG. 3C). A plating resist 155 is formed on the second seed layer 151. A second electrolytic plating film 153 is formed by electrolytic plating on the second seed layer 151 exposed from the plating resist 155. At the same time, the second openings (6O2) are filled by the second electrolytic plating film 153 (FIG. 4A). The plating resist 155 is removed. The second seed layer 151 exposed from the second electrolytic plating film 153 is removed. An on-second-resin-insulating-layer conductor layer (1582U) is formed on the second resin insulating layer 1402. At the same time, second via conductors 602 are formed in the second openings (6O2) (FIG. 4B). The thickness (c3) of the on-second-resin-insulating-layer conductor layer (1582U) is 16.0 μm.

Figure 5A:
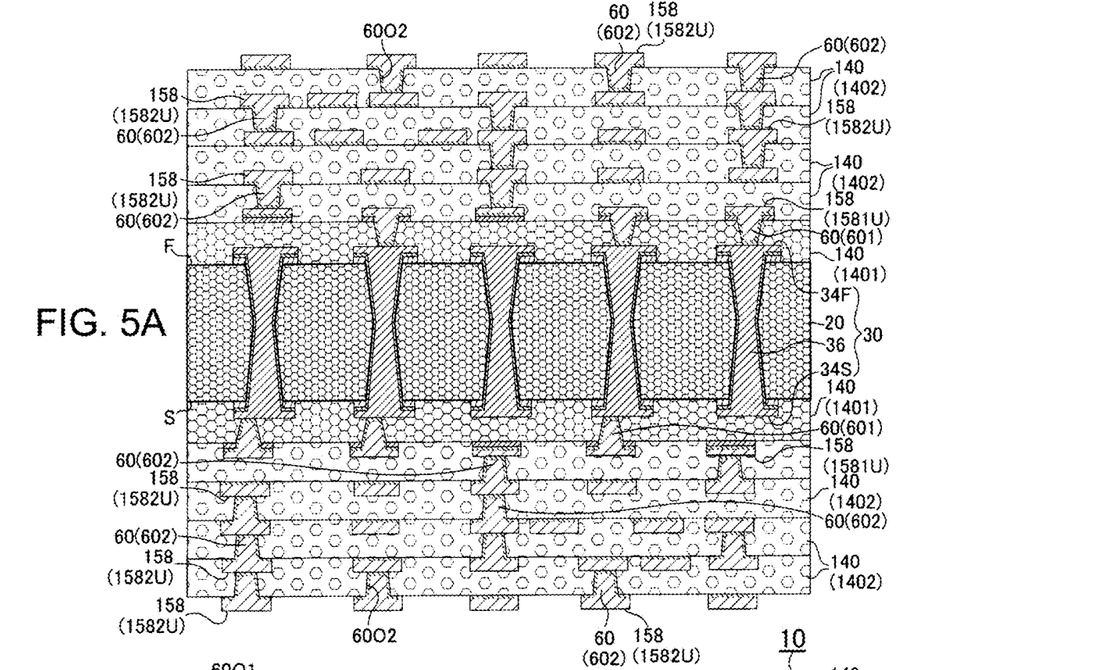
FIGS. 5A and 5B are manufacturing process diagrams of the printed wiring board of the embodiment of the present invention.

On the second resin insulating layer 1402 and the on-second-resin-insulating-layer conductor layer (1582U) illustrated in FIG. 4B, formation of a second resin insulating layer 1402 and formation of an on-second-resin-insulating-layer conductor layer (1582U) are repeated three times (FIG. 5A). The formation of the second resin insulating layer 1402 includes formation of the second openings (6O2). The formation of the on-second-resin-insulating-layer conductor layer (1582U) includes formation of the second via conductors 602.

The thickness (c4) of each of the second resin insulating layers 1402 is 30 μm. The thickness (c3) of each of the on-second-resin-insulating-layer conductor layers (1582U) is 16.0 μm. The second top diameter (c1) of each of the second openings (6O2) is 65 μm. The second bottom diameter (c2) of each of the second openings (6O2) is 50 μm.

Figure 5B:
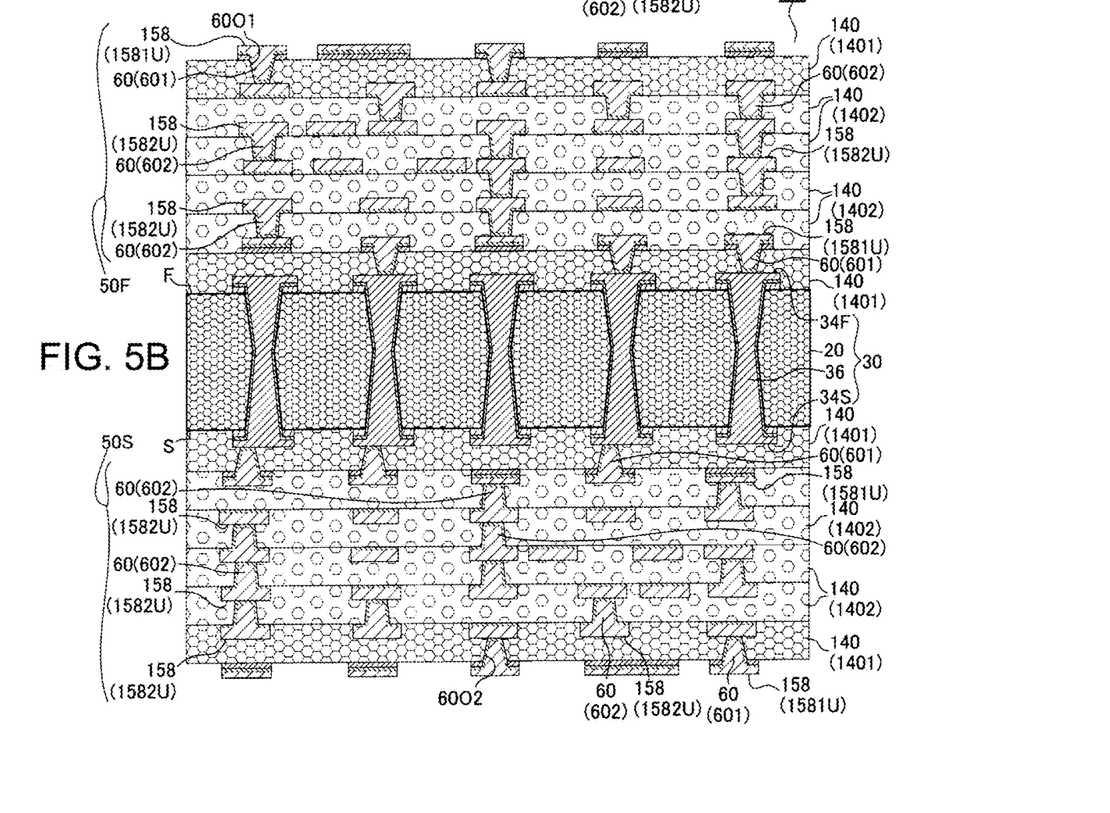

Next, on the second resin insulating layer 1402 and the on-second-resin-insulating-layer conductor layer (1582U), the processes illustrated in FIGS. 2B-3B are sequentially performed. On the second resin insulating layer 1402 and the on-second-resin-insulating-layer conductor layer (1582U), a first resin insulating layer (uppermost resin insulating layer) 1401 and an on-first-resin-insulating-layer conductor layer (uppermost conductor layer) (1581U) on the uppermost resin insulating layer are formed. The first via conductors 601 penetrating the uppermost resin insulating layer and connecting the on-first-resin-insulating-layer conductor layer (1581U) and the on-second-resin-insulating-layer conductor layer (1582U) to each other are formed in the uppermost resin insulating layer. At this time, a lowermost resin insulating layer 1401 and an on-first-resin-insulating-layer conductor layer (lowermost conductor layer) (1581U) on the lowermost resin insulating layer 1401 are formed. The first via conductors 601 penetrating the lowermost resin insulating layer 1401 and connecting the on-first-resin-insulating-layer conductor layer (1581U) and the on-second-resin-insulating-layer conductor layer (1582U) to each other are formed in the lowermost resin insulating layer 1401 (FIG. 5B).

A thickness (b4) of the uppermost resin insulating layer 1401 and a thickness (b4) of the lowermost resin insulating layer 1401 are 30 μm. The first top diameter (b1) of each of the first openings (6O1) is 65 μm. The first bottom diameter (b2) of each of the first openings (6O1) is 45 μm. A thickness (b3) of the uppermost conductor layer and a thickness (b3) of the lowermost conductor layer are 15.5 μm.

The first solder resist layer (90F) having the first openings (92F) is formed on the uppermost resin insulating layer 1401 and the uppermost conductor layer (1581U). The second solder resist layer (90S) having the second openings (92S) is formed on the lowermost resin insulating layer 1401 and the lowermost conductor layer (1581U). The uppermost conductor layer (1581U) exposed from the first openings (92F) forms the pads (93F) for connecting to an electronic component. The lowermost conductor layer (1581U) exposed from the second openings (92S) forms the pads (93S) for connecting to a motherboard. The metal film (94F) formed of Ni/Pd/Au is formed on the pads (93F). The metal film (94S) is formed on the pads (93S), and the printed wiring board 10 is completed (FIG. 1A).

According to Japanese Patent Laid-Open Publication No. 2004-319888, a conductor layer on the insulating layer having a reinforcing material and a conductor layer on the insulating layer having no reinforcing material are formed using the same method. Therefore, when openings for via conductors are 80 μm or less, it is expected to be difficult to fill the openings for via conductors formed in the insulating layer having a reinforcing material. Or, it is expected to be difficult to fill the openings for via conductors formed in the insulating layer having no reinforcing material.

A printed wiring board according to an embodiment of the present invention includes a core substrate having a first surface and a second surface on the opposite side with respect to the first surface, a first build-up layer formed on the first surface of the core substrate, and a second build-up layer formed on the second surface of the core substrate. The first build-up layer and the second build-up layer have resin insulating layers, conductor layers, and via conductors penetrating the resin insulating layers. The resin insulating layers and the conductor layers are alternately laminated. The resin insulating layers include first resin insulating layers that each have a reinforcing material and second resin insulating layers that do not each have a reinforcing material.

The conductor layers include on-first-resin-insulating-layer conductor layers that are respectively formed directly on the first resin insulating layers, below-first-resin-insulating-layer conductor layers that are respectively formed directly below the first resin insulating layers, on-second-resin-insulating-layer conductor layers that are respectively formed directly on the second resin insulating layers, and below-second-resin-insulating-layer conductor layers that are respectively formed directly below the second resin insulating layers. The first resin insulating layers have first openings that penetrate the first resin insulating layers and reach the below-first-resin-insulating-layer conductor layers. The second resin insulating layers have second openings that penetrate the second resin insulating layers and reach the below-second-resin-insulating-layer conductor layers. The via conductors include first via conductors that are formed in the first openings and connect the on-first-resin-insulating-layer conductor layers to the below-first-resin-insulating-layer conductor layers, and second via conductors that are formed in the second openings and connect the on-second-resin-insulating-layer conductor layers to the below-second-resin-insulating-layer conductor layers. The first via conductors and the on-first-resin-insulating-layer conductor layers are integrally formed. The second via conductors and the on-second-resin-insulating-layer conductor layers are integrally formed. The first via conductors have a first top diameter formed at interfaces between the on-first-resin-insulating-layer conductor layers and the first via conductors, and have a first bottom diameter formed at interfaces between the below-first-resin-insulating-layer conductor layers and the first via conductors. The second via conductors have a second top diameter formed at interfaces between the on-second-resin-insulating-layer conductor layers and the second via conductors, and have a second bottom diameter formed at interfaces between the below-second-resin-insulating-layer conductor layers and the second via conductors. The on-first-resin-insulating-layer conductor layers are formed of a metal foil on the first resin insulating layers, a first seed layer on the metal foil and a first electrolytic plating film on the first seed layer. The on-second-resin-insulating-layer conductor layers are formed of a second seed layer on the second resin insulating layers and a second electrolytic plating film on the second seed layer. The first top diameter and the second top diameter are substantially equal to each other, and the first bottom diameter is smaller than the second bottom diameter. A thickness of each of the on-first-resin-insulating-layer conductor layers and a thickness of each of the on-second-resin-insulating-layer conductor layers are substantially equal to each other.

A printed wiring board according to an embodiment of the present invention is formed to include the core substrate, and the first build-up layer and the second build-up layer sandwiching the core substrate. The first build-up layer and the second build-up layer are formed to include the resin insulating layers, the conductor layers, and the via conductors that penetrate the resin insulating layers and connect the conductor layers to each other. The resin insulating layers include the first resin insulating layers that each have a reinforcing material and the second resin insulating layers that do not each have a reinforcing material. The via conductors include the first via conductors filling the first openings penetrating the first resin insulating layers and the second via conductors filling the second openings penetrating the second resin insulating layers. The top diameter of the first openings and the top diameter of the second openings are substantially equal to each other. The bottom diameter of the first openings is smaller than the bottom diameter of the second openings. In the embodiment, a volume of each of the first openings and a volume of each of the second openings can be adjusted by the diameters of the openings. The volume of each of the first openings can be made smaller than the volume of each of the second openings. The conductor layers include the on-first-resin-insulating-layer conductor layers respectively formed on the first resin insulating layers and the on-second-resin-insulating-layer conductor layers respectively formed on the second resin insulating layers. The on-first-resin-insulating-layer conductor layers are each formed of a metal foil, a first seed layer and a first electrolytic plating film, and the on-second-resin-insulating-layer conductor layers are each formed of a second seed layer and a second electrolytic plating film. The on-second-resin-insulating-layer conductor layers do not each include a metal foil. However, the on-first-resin-insulating-layer conductor layers each include a metal foil. Therefore, the thickness of each of the on-first-resin-insulating-layer conductor layers is likely to become larger than the thickness of each of the on-second-resin-insulating-layer conductor layers. However, in the embodiment, the formation of the on-first-resin-insulating-layer conductor layers and the filling of the first openings are simultaneously performed. The formation of the on-second-resin-insulating-layer conductor layers and the filling of the second openings are simultaneously performed. Then, the volume of each of the first openings and the volume of each of the second openings can be adjusted by the bottom diameters. For example, a time (first time) for filling the first openings with electrolytic plating can be shorter than a time (second time) for filling the second openings with electrolytic plating. A thickness of the electrolytic plating film (first electrolytic plating film) forming the on-first-resin-insulating-layer conductor layers can be made smaller than a thickness of the electrolytic plating film (second electrolytic plating film) forming the on-second-resin-insulating-layer conductor layers. The thickness of each of the on-first-resin-insulating-layer conductor layers that each have a metal foil and the thickness of each of the on-second-resin-insulating-layer conductor layers that do not each have a metal foil can be made substantially equal to each other. Even when the printed wiring board has the different kinds of resin insulating layers, the thicknesses of the conductor layers are substantially equal to each other. Warpage of the printed wiring board can be reduced. Since the thicknesses of the conductor layers are substantially equal to each other, by adjusting the arrangement of the first resin insulating layers and the second resin insulating layers, a direction of the warpage of the printed wiring board can be controlled.

Since the thicknesses of the conductor layers are substantially equal to each other, a wiring density of the on-first-resin-insulating-layer conductor layers can be made close to a wiring density of the on-second-resin-insulating-layer conductor layers. A high density printed wiring board can be provided.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
    a core substrate;
    a first build-up layer formed on a first surface of the core substrate and comprising a plurality of resin insulating layers, a plurality of conductor layers, and a plurality of via conductors penetrating through the resin insulating layers; and
    a second build-up layer formed on a second surface of the core substrate on an opposite side with respect to the first surface and comprising a plurality of resin insulating layers, a plurality of conductor layers, and a plurality of via conductors penetrating through the resin insulating layers,
    wherein the plurality of resin insulating layers in each of the first and second build-up layers includes a first resin insulating layer comprising a reinforcing material and a second resin insulating layer not containing a reinforcing material, the plurality of conductor layers in each of the first and second build-up layers includes an on-first-resin-insulating-layer conductor layer formed directly on a surface of the first resin insulating layer, a below-first-resin-insulating-layer conductor layer formed directly on an opposite surface of the first resin insulating layer, an on-second-resin-insulating-layer conductor layer formed directly on a surface of the second resin insulating layer, and a below-second-resin-insulating-layer conductor layer formed directly on an opposite surface of the second resin insulating layer, the plurality of via conductors in each of the first and second build-up layers includes a first via conductor connecting the on-first-resin-insulating-layer conductor layer and the below-first-resin-insulating-layer conductor layer such that the first via conductor and the on-first-resin-insulating-layer conductor layer are integrally formed, and a second via conductor connecting the on-second-resin-insulating-layer conductor layer and the below-second-resin-insulating-layer conductor layer such that the second via conductor and the on-second-resin-insulating-layer conductor layer are integrally formed, the first and second via conductors in each of the first and second build-up layers are formed such that a first top diameter of the first via conductor at an interface between the on-first-resin-insulating-layer conductor layer and the first via conductor is substantially equal to a second top diameter of the second via conductor at an interface between the on-second-resin-insulating-layer conductor layer and the second via conductor, and that a first bottom diameter of the first via conductor at an interface between the below-first-resin-insulating-layer conductor layer and the first via conductor is smaller than a second bottom diameter of the second via conductor at an interface between the below-second-resin-insulating-layer conductor layer and the second via conductor, the on-first-resin-insulating-layer conductor layer in each of the first and second build-up layers comprises a metal foil on the first resin insulating layer, a first seed layer on the metal foil and a first electrolytic plating film on the first seed layer, the on-second-resin-insulating-layer conductor layer in each of the first and second build-up layers comprises a second seed layer on the second resin insulating layer and a second electrolytic plating film on the second seed layer, and each of the first and second build-up layers is formed such that the on-first-resin-insulating-layer conductor layer has a thickness substantially equal to a thickness of the on-second-resin-insulating-layer conductor layer.

2. The printed wiring board according to claim 1, wherein the first resin insulating layer in the first build-up layer is forming an uppermost resin insulating layer.

3. The printed wiring board according to claim 2, wherein the first build-up layer has the first resin insulating layers formed in a plurality such that one of the plurality of first resin insulating layers is forming an on-first-surface resin insulating layer formed directly on the first surface of the core substrate.

4. The printed wiring board according to claim 3, wherein the first build-up layer has the second resin insulating layer formed in a plurality such that all resin insulating layers between the uppermost resin insulating layer and the on-first-surface resin insulating layer are the plurality of second resin insulating layers respectively.

5. The printed wiring board according to claim 4, wherein the first build-up layer is formed such that a number of the plurality of second resin insulating layers is in a range of 3 to 5.

6. The printed wiring board according to claim 2, wherein the first resin insulating layer in the second build-up layer is forming a lowermost resin insulating layer.

7. The printed wiring board according to claim 6, wherein the second build-up layer has the first resin insulating layer formed in a plurality such that one of the plurality of first resin insulating layers is forming an on-second-surface resin insulating layer formed directly on the second surface of the core substrate.

8. The printed wiring board according to claim 7, wherein the second build-up layer has the second resin insulating layer formed in a plurality such that all resin insulating layers between the lowermost resin insulating layer and the on-second-surface resin insulating layer are the plurality of second resin insulating layers respectively.

9. The printed wiring board according to claim 8, wherein the second build-up layer is formed such that a number of the plurality of second resin insulating layers is in a range of 3 to 5.

10. The printed wiring board according to claim 9, wherein the first and second build-up layers are formed such that the number of the plurality of second resin insulating layers in the first build-up layer and the number of the plurality of second resin insulating layers in the second build-up layer are the same.

11. The printed wiring board according to claim 10, wherein the first resin insulating layer in each of the first and second build-up layers has a first opening in which the first via conductor is formed such that the reinforcing material of the first resin insulating layer is protruding into the first opening.

12. The printed wiring board according to claim 11, wherein the first via conductor in each of the first and second build-up layers has the reinforcing material extending into the first via conductor.

13. The printed wiring board according to claim 10, wherein the first resin insulating layer in each of the first and second build-up layers has a first opening in which the first via conductor is formed, and the second resin insulating layer in each of the first and second build-up layers has a second opening in which the second via conductor is formed such that a volume of the first opening is smaller than a volume of the second opening.

14. The printed wiring board according to claim 8, wherein the first and second build-up layers are formed such that the number of the plurality of second resin insulating layers in the first build-up layer and the number of the plurality of second resin insulating layers in the second build-up layer are the same.

15. The printed wiring board according to claim 6, wherein the first resin insulating layer in each of the first and second build-up layers has a first opening in which the first via conductor is formed such that the reinforcing material of the first resin insulating layer is protruding into the first opening.

16. The printed wiring board according to claim 15, wherein the first via conductor in each of the first and second build-up layers has the reinforcing material extending into the first via conductor.

17. The printed wiring board according to claim 6, wherein the first resin insulating layer in each of the first and second build-up layers has a first opening in which the first via conductor is formed, and the second resin insulating layer in each of the first and second build-up layers has a second opening in which the second via conductor is formed such that a volume of the first opening is smaller than a volume of the second opening.

18. The printed wiring board according to claim 1, wherein the first resin insulating layer in each of the first and second build-up layers has a first opening in which the first via conductor is formed such that the reinforcing material of the first resin insulating layer is protruding into the first opening.

19. The printed wiring board according to claim 18, wherein the first via conductor in each of the first and second build-up layers has the reinforcing material extending into the first via conductor.

20. The printed wiring board according to claim 1, wherein the first resin insulating layer in each of the first and second build-up layers has a first opening in which the first via conductor is formed, and the second resin insulating layer in each of the first and second build-up layers has a second opening in which the second via conductor is formed such that a volume of the first opening is smaller than a volume of the second opening.

\* \* \* \* \*